United States Patent
Lee et al.

(10) Patent No.: US 8,707,148 B2
(45) Date of Patent: Apr. 22, 2014

(54) METHOD OF PRODUCING AND DECODING ERROR CORRECTION CODE AND APPARATUS THEREFOR

(75) Inventors: In-Ki Lee, Daejeon-si (KR); Deock-Gil Oh, Daejeon-si (KR); Ji-Won Jung, Busan-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 100 days.

(21) Appl. No.: 13/307,566

(22) Filed: Nov. 30, 2011

(65) Prior Publication Data

US 2012/0144262 A1    Jun. 7, 2012

(30) Foreign Application Priority Data

Dec. 1, 2010 (KR) .................. 10-2010-0121255

(51) Int. Cl.
G06F 11/00 (2006.01)
H03M 13/00 (2006.01)

(52) U.S. Cl.
USPC .......................................... 714/801

(58) Field of Classification Search
None
See application file for complete search history.

(56) References Cited

U.S. PATENT DOCUMENTS

| | | | |
|---|---|---|---|
| 5,425,038 A * | 6/1995 | Chen | 714/755 |
| 7,188,295 B2 * | 3/2007 | Van Dijk et al. | 714/755 |
| 7,702,986 B2 * | 4/2010 | Bjerke et al. | 714/755 |
| 8,171,374 B2 * | 5/2012 | Miyazaki | 714/758 |
| 8,407,560 B2 * | 3/2013 | Ordentlich et al. | 714/763 |
| 2004/0199860 A1 * | 10/2004 | Kim et al. | 714/801 |
| 2005/0149833 A1 * | 7/2005 | Worley et al. | 714/781 |
| 2007/0266274 A1 * | 11/2007 | Lin | 714/699 |
| 2009/0100311 A1 * | 4/2009 | Song et al. | 714/752 |
| 2010/0269009 A1 * | 10/2010 | Okamura et al. | 714/752 |
| 2011/0197105 A1 * | 8/2011 | Murakami et al. | 714/752 |
| 2012/0017136 A1 * | 1/2012 | Ordentlich et al. | 714/763 |

OTHER PUBLICATIONS

Serially Concatenated Continuous Phase Modulation with Extended BCH Codes (*Wireless Communications, IEEE Transactions, vol. 8, Issue 6, p. 3260-3269, May 2009*).

* cited by examiner

*Primary Examiner* — Guerrier Merant
(74) *Attorney, Agent, or Firm* — Staas & Halsey LLP (57) ABSTRACT

An apparatus and method for producing error correction code and error correction decoding are provided. The method for producing error correction code includes generating an asymmetric matrix by arranging input data bits in a matrix of a predefined size and adding a zero bit column and/or a zero bit row, each of the column and the row consisting of zero bits, to the matrix; primarily encoding the asymmetric matrix by adding one or more parity bits to each row; and secondarily encoding the primarily encoded matrix by adding one or more parity bits to each column of the encoded matrix.

15 Claims, 7 Drawing Sheets

| $P_X P_X P_X \ldots P_X P_X P_X$ | $P_Y P_Y P_Y P_Y \ldots\ldots P_Y P_Y P_Y P_Y$ | |
|---|---|---|
| $P_X P_X P_X \ldots P_X P_X P_X$ | $P_Y P_Y P_Y P_Y \ldots\ldots P_Y P_Y P_Y P_Y$ | ⌒250 |
| | K K K K ..... K K K K | |
| | K K K K ..... K K K K | |
| | K K K K ..... K K K K | |
| | | ⌒210 |
| | K K K K ..... K K K K | |
| | K K K K ..... K K K K | |
| $P_X P_X P_X \ldots P_X P_X P_X$ | K K K K ..... K K K K | |
| $P_X P_X P_X \ldots P_X P_X P_X$ | Z Z Z Z ..... Z Z Z Z | |

| $P_X P_X P_X \dots P_X P_X P_X$ | $P_Y P_Y P_Y \dots\dots P_Y P_Y P_Y P_Y P_Y$ | |
|---|---|---|
| | $\vdots \qquad\qquad \vdots \qquad\qquad \vdots$ | ~250 |
| | $P_Y P_Y P_Y \dots\dots P_Y P_Y P_Y P_Y P_Y$ | |
| | K K K ..... K K K | Z Z |
| | K K K ..... K K K | Z Z |
| $\vdots \qquad\qquad \vdots$ | K K K ..... K K K | Z Z |
| | $\vdots \qquad\qquad \vdots \qquad \vdots$ | ~230 |
| | K K K ..... K K K | Z Z |
| $P_X P_X P_X \dots P_X P_X P_X$ | K K K ..... K K K | Z Z |
| $P_X P_X P_X \dots P_X P_X P_X$ | K K K ..... K K K | Z Z |

| $P_X P_X P_X$ ... $P_X P_X P_X$ | $P_Y P_Y P_Y$ ..... $P_Y P_Y P_Y$ $P_Y P_Y$ |  |
|---|---|---|
| | ⋮           ⋮          ⋮ | |
| | $P_Y P_Y P_Y$ ..... $P_Y P_Y P_Y$ $P_Y P_Y$ | ~250 |
| | K K K ..... K K K \| Z Z | |
| | K K K ..... K K K \| Z Z | |
| ⋮           ⋮ | K K K ..... K K K \| Z Z | ~210 |
| | ⋮           ⋮          ⋮ | |
| | K K K ..... K K K \| Z Z | |
| $P_X P_X P_X$ ... $P_X P_X P_X$ | Z Z Z ..... Z Z Z \| Z Z | |
| $P_X P_X P_X$ ... $P_X P_X P_X$ | Z Z Z ..... Z Z Z \| Z Z | |

METHOD OF PRODUCING AND DECODING ERROR CORRECTION CODE AND APPARATUS THEREFOR

CROSS-REFERENCE TO RELATED APPLICATION(S)

This application claims the benefit under 35 U.S.C. §119 (a) of Korean Patent Application No. 10-2010-0121255, filed on Dec. 1, 2010, in the Korean Intellectual Property Office, the entire disclosure of which is incorporated herein by reference for all purposes.

BACKGROUND

1. Field

The following description relates to a method and apparatus for error correction code generation and error correction decoding, and more particularly, to a method and apparatus for error correction code generation and error correction decoding for encoding and decoding data using error correction code in communication between terminals.

2. Description of the Related Art

Recently, satellite communication technologies have been developed in accordance with digital video broadcasting-return channel by satellite (DVB-RCS) standards. A conventional DVB-RCS system supports ADSL-based low speed data access techniques. However, the present high-speed data service requires research and development of very small aperture terminal (VSAT) technique as new paradigm. Hence, studies on transmission efficiency per bandwidth which is close to Shannon limit, high efficiency coding, flexibility and efficiency of return link transmission format, and transmission efficiency of transmission media access control (MAC) and upper layers have been conducted.

Error correction code is generally used in today's communication system. The code enables detection and correction of an error by adding extra bits to a message. Particularly, turbo product code (TPC) has been proved to increases power efficiency and maximize data transfer rate. TPC is relatively large code that is established from a small code word block. TPC is capable of transmitting data within 1 dB of Shannon limit.

In respect of high-efficient encoding scheme, turbo coding is adopted as standard for various wireless communication systems since turbo coding performance has been verified. Recently, Bose-Chaudhuri-Hocquenghem (BCH) code which is combined with continuous modulation (CPM) scheme using soft-decision decoding has been proposed. However, BCH code which is a kind of a cyclic code is not affected by the number iterations when it is combined with a linear modulation scheme. Accordingly, the number of iterations cannot be a dominant factor to determine BCH performance, and thus the optimal performance of the BHC is code may not be achieved.

SUMMARY

In one general aspect, there is provided a method for producing error correction code, the method including: generating an asymmetric matrix by arranging input data bits in a matrix of a predefined size and adding a zero bit column and/or a zero bit row, each of the column and the row consisting of zero bits, to the matrix; primarily encoding the asymmetric matrix by adding one or more parity bits to each row; and secondarily encoding the primarily encoded matrix by adding one or more parity bits to each column of the encoded matrix.

In another general aspect, there is provided a method for error correction decoding, the method including: receiving a data matrix which has been error-correction encoded and adding as many zero bits as the number of zero bits that were added when the data matrix was encoded; checking a parity bit of each column of the data matrix which have the zero bits added thereto in an effort to primarily decode data in the each column; and checking a parity bit of each row of the data matrix which have the zero bits added thereto in an effort to secondarily decode data in the each row.

In another general aspect, there is provided an apparatus for error correction decoding, the apparatus including: a zero bit adder configured to receive an error-correction encoded data to matrix and add as many zero bits as the number of zero bits that were added when the matrix was encoded; a primary decoder configured to check a parity bit of each column of the matrix which have the zero bits added thereto in an effort to decode data of the each column; and a secondary decoder configured to check a parity bit of each row of the matrix decoded by the primary decoder in an effort to decode data of the each row.

In another general aspect, there is provided an apparatus for error correction decoding, the apparatus including: a zero bit adder configured to receive an error-correction encoded data matrix and add as many zero bits as the number of zero bits that were added when the matrix was encoded; a primary decoder configured to check a parity bit of each column of the matrix which have the zero bits added thereto in an effort to decode data of the each column; and a secondary decoder configured to check a parity bit of each row of the matrix decoded by the primary decoder in an effort to decode data of the each row.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 1:
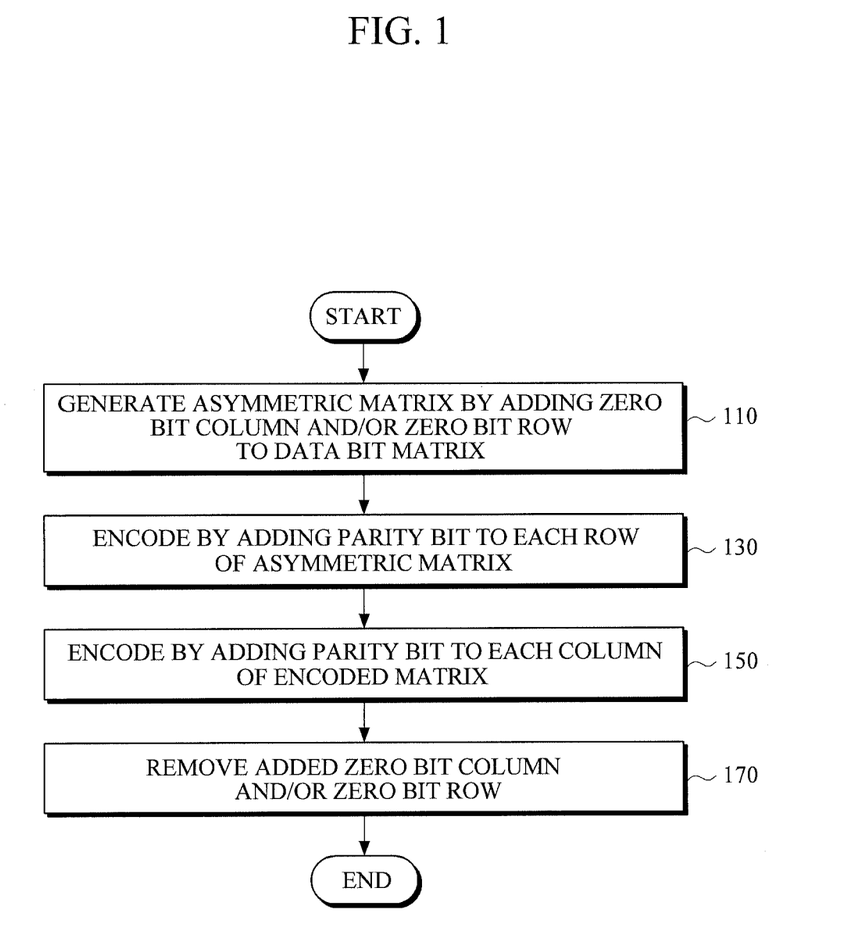
FIG. 1 is a flowchart illustrating an example of a method of producing error correction code.

FIG. 1 illustrates a flowchart of an example of a method of producing error correction code.

Referring to FIG. 1, data bits are input and arranged as a matrix of a predefined size, and a column of zero bits and/or a row or zero bits are added to the matrix to generate an asymmetric matrix (110). The size of the matrix of the input data bits may vary with settings. This is to arrange the input data bits in a matrix of a definite size for a turbo product code (TPC).

The addition of a zero bit column and/or a zero bit row to the matrix of the data bits is one of methods for producing error correction code. That is, a zero bit column and/or a zero bit row, each including meaningless data, i.e., a zero bit, is inserted into the matrix of the data bits. The insertion of the zero bit column and/or the zero bit row results in an asymmetric matrix of the data bits. Detailed description of insertion of the zero bit column and/or the zero bit row will be described later with reference to FIGS. 2A to 2C.

Then, primary encoding is performed by adding a parity bit to each row of the asymmetric matrix consisting of the data bits and a zero bit(s) (130). The parity bit refers to a bit to be added to original data in effort to detect an error in data transmission. In TPC, each row of the matrix of the data bits is encoded. In this case, the data bit included in each row is identified and the parity bit is calculated. The calculated parity bit is added to an end of the data bit or the zero bit of each row.

A parity bit is added to an end of a block of bytes to make the number of 1-bits even (even parity) or odd (odd parity). For example, to make 7-bit data, e.g., '0010110,' even parity, a parity bit of '1' is added to the data '0010110' resulting in data '00101101.' On the other hand, to make the same data '0010110' odd parity, a parity bit of '0' is added thereto. In this case, there may be one or more parity bits.

The number of parity bits to be added may vary to maintain a constant coding rate. For example, each row may consist of 63 bits, among which 57 bits are only data bits or both data bit and zero bits. In this case, 6 bits are parity bits which are added to an end of each row. Accordingly, after the primary encoding, the length of each row of the asymmetric matrix is extended to 63 bits.

Secondary encoding is performed by adding a parity bit to each column of the matrix which has undergone the primary encoding (150). As described above, the primary encoding refers to encoding on each row of the asymmetric matrix. The secondary encoding refers to encoding of each column of the matrix after the primary encoding. In TPC, subsequent to the encoding of rows of the data bit matrix, encoding on columns is performed. Therefore, two-dimensional encoding is realized.

In the secondary encoding, a parity bit is calculated using data bit of the primarily encoded matrix. A method of calculating a parity bit is the same as in the primary encoding. The calculated number of parity bits may vary with settings. For example, a length of each is column is 64 bits, and 51 bits of the entire length are data bits or correspond to a length of the sum of data bits and zero bits. In this case, parity bits may be calculated as 13 bits.

The calculated parity bits may be added to an end of data bits or an end of zero bits in each column. Therefore, the size of the column of the asymmetric matrix may be expanded. Through primary encoding, each row of the encoded matrix has a length of 63 bits, and through secondary encoding, each column of the encoded matrix has a length of 64 bits. A coding rate may be calculated using the encoded matrix.

In TPC, a coding rate may be obtained by Equation 1 below.

$$R = \frac{k_1}{n_1} X \frac{k_2}{n_2} \quad (1)$$

In Equation 1, the number of the entire bits in each row is represented as n1, and the number of data bits (or the sum of data bits and zero bits) in each row is represented as k1. The number of the entire bits in each column is represented as n2, and the number of data bits (or the sum of data bits and zero bits) in each column is represented as k2. Under this condition, a coding rate R is the product of the entire bit to the data bit (or the sum of data bits and zero bits) ratios of each row and column. For example, in a case where each row has a length of 63 bits including 53 bits that correspond to the length of data bits (or the sum of data bits and zero bits), and each column has a length of 64 bits including 51 bits that correspond to data bits (or the sum of data bits and zero bits), a coding rate is 0.720. The calculated coding rate conforms to coding rates of 0.591, 0.705, and 0.716 which are required for DVB-RCS NG standard.

Figure 2A:
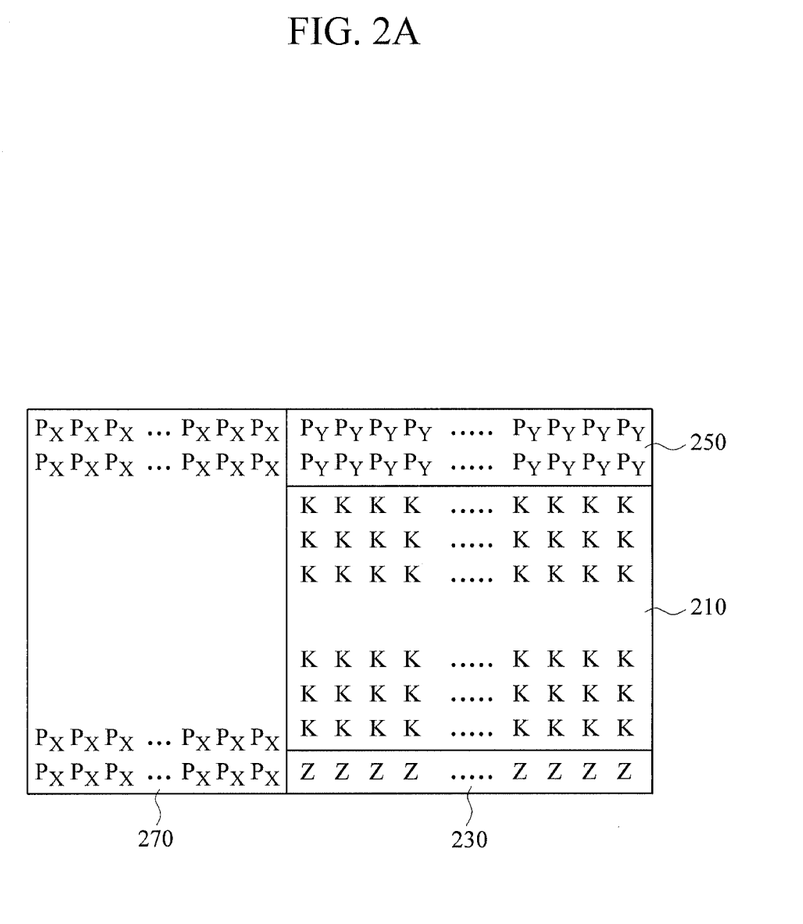
FIG. 2A is a diagram illustrating an example of encoding a matrix having a zero bit column inserted therein.
Figure 2B:
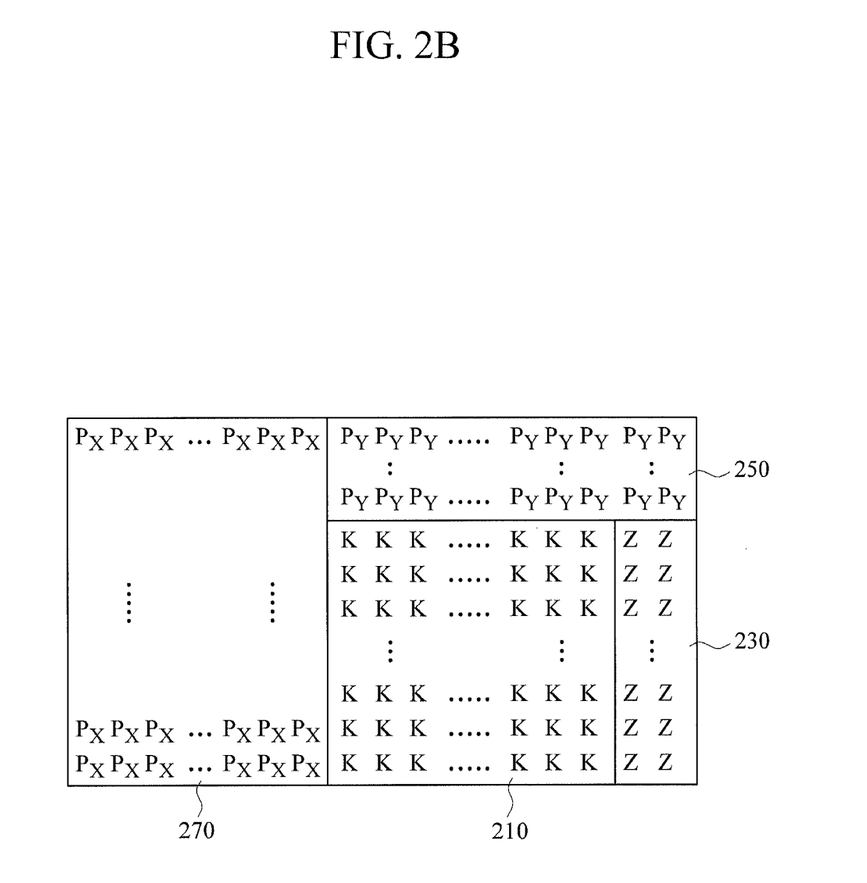
FIG. 2B is a diagram illustrating an example of encoding a matrix having a zero bit row inserted therein.
Figure 2C:
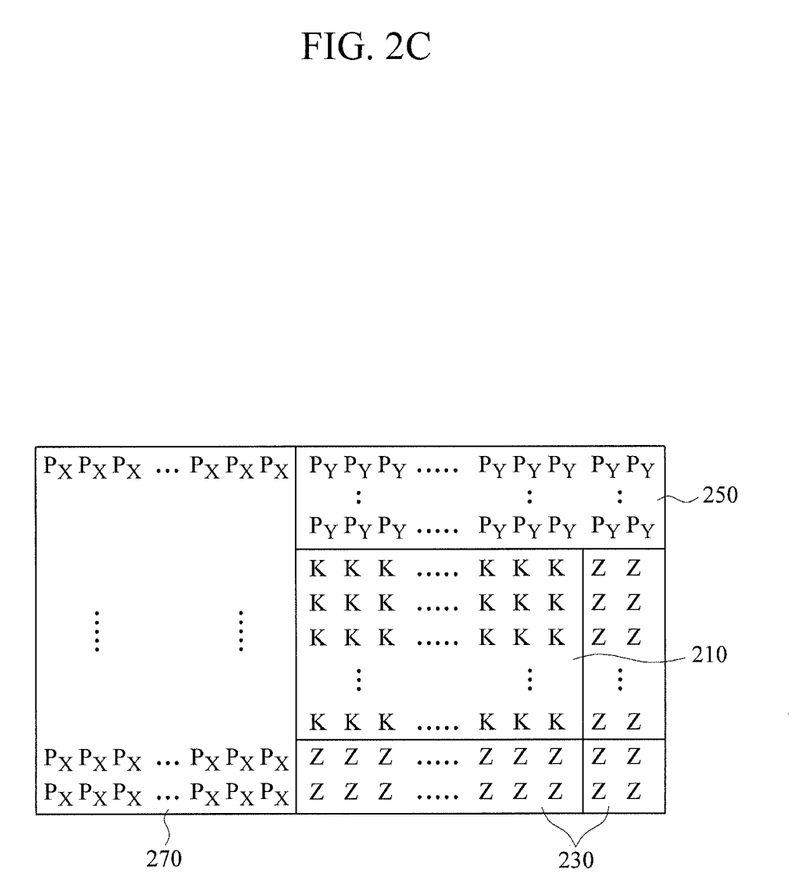
FIG. 2C is a diagram illustrating an example of encoding a matrix having a zero bit column and a zero bit row inserted therein.

FIG. 2A illustrates a diagram of an example of encoding a matrix having a zero bit column inserted therein. FIG. 2B illustrates a diagram of an example of encoding a matrix having a zero bit row inserted therein, and FIG. 2C illustrates a diagram of an example of encoding a matrix having a zero bit column and a zero bit row inserted therein.

Referring to FIG. 2A, a matrix consisting of data bits is encoded after a zero bit column including a block of zero bits is added thereto. In detail, data bits 210 are arranged as a matrix of a definite size, and the zero bit column including a block of zero bits 230 is added to the matrix of the data bits 210. In this case, the number of zero bits 230 to be added may vary with a coding rate to be implemented. The coding rate may be calculated by multiplying a first coding rate and a second coding rate. The first coding rate is obtained from each row of the encoded matrix by dividing the number of data bits of a row by a value resulting from subtracting the number of zero bits from the number of the entire bits of the row, and the second coding rate is obtained from each column of the encoded matrix by dividing the number of data bits of a column by the number of the entire bits of the column. The number of zero bits according to a coding rate may be calculated by Equation 2 below.

$$R_c = \frac{k_1 k_2}{(n_1 - Z)(n_2)} \quad (2)$$

In equation 2, a coding rate Rc of a matrix to which a zero bit column is added is obtained by dividing the product of the number k1 of data bits 210 of a row, excluding the zero bits 230, and the number k2 of data bits of a column by the product of the number n2 of the entire bits of the column and a value resulting from subtracting the number of zero bits 230 from the number n1 of the entire bits of the row. Thus, the number of zero bits 230 may be obtained from a desired coding rate and the number of data bits 210.

In primary encoding, parity bits 250 may be calculated using values of data bits 210 of each row. Secondary encoding is performed on the encoded matrix including the data bits 210, the zero bits 230, and the parity bits 250. As a result, parity bits 270 are added to each column. For example, each row of the matrix encoded through the primary encoding and the secondary encoding includes 57 bits which are the sum of the data bits 210 and the zero bits 230, and 6 bits as parity bits 250. In addition, each column includes 51 bits as data bits and 13 bits as parity bits 270.

Referring to FIG. 2B, a matrix consisting of data bits is encoded after a zero bit row is added thereto. Specifically, the data bits 210 are arranged as a matrix of a definite size and the zero bit row comprising of zero bits is added to the matrix. In this case, the number of zero bits 230 may vary with a coding rate to be implemented. The coding rate may be calculated by multiplying a first coding rate and a second coding rate, where the first coding rate is obtained from a row of the encoded matrix by dividing the number of data bits included in the row by the number of the entire bits of the row and the second coding rate is obtained from a column of the encoded matrix by dividing the number of data bits included in the column by a value resulting from subtracting the number of zero bits from the number of the entire bits of the column. The number of zero bits according to a coding rate may be obtained by Equation 3 below.

$$R_r = \frac{k_1 k_2}{n_1(n_2 - Z)} \quad (3)$$

In Equation 3, a coding rate Rr of the matrix to which the zero bit row is added is obtained by dividing the product of the number k1 of data bits 210 included in a row and the number k2 of data bits 210, excluding the zero bits 230, included in a column by the product of the number n1 of the entire bits of the row and a value resulting from substracting the number of zero bits 230 from the number n2 of the entire bits of the column. Thus, the number of zero bits 230 may be calculated from the desired coding rate and the number of data bits 210.

In primary encoding, parity bits 250 may be calculated using values of data bits 210 in each row. Secondary encoding is performed on the encoded matrix including the data bits 210, the zero bits 230, and the parity bits 250. Accordingly, parity bits 270 are added to each column. For example, each row of the matrix encoded through the primary encoding and the secondary encoding includes 57 bits as the data bits 210 and 6 bits as the parity bits 250, and each column includes 51 bits as the sum of the data bits and the zero bits and 13 bits as the parity bits.

Referring to FIG. 2C, a matrix consisting of data bits is encoded after a zero bit row and a zero bit column are added thereto. In detail, the data bits 210 are arranged in a matrix of a definite size and the zero bit row comprising of zero bits 230 and the zero bit column comprising of zero bits 230 are added to the matrix. In this case, the number of zero bits 230 to be added may vary with a coding rate to be implemented. The coding rate may be calculated by multiplying a first coding rate and a second coding rate, where the first coding rate is obtained from a row of the encoded matrix by dividing the number of data bits included in the row by a value resulting from subtracting the number of zero bits from the number of the entire bits of the row and the second coding rate is obtained from a column of the encoded matrix by dividing the number of data bits included in the column by a value resulting from subtracting the number of zero bits from the number of the entire bits of the column. The number of zero bits according to the coding rate may be calculated using Equation 4 below.

$$R_{rc} = \frac{k_1 k_2}{(n_1 - Z)(n_2 - Z)} \quad (4)$$

In Equation 4, the coding rate Rrc of the matrix to which the zero bit column and the zero bit row are added is calculated by dividing the product of the number k1 of the data bits 210 included in each row and the number k2 of the data bits 210 included in each column by the product of a value resulting from subtracting the number of zero bits from the number n1 of the entire bits of the row and a value resulting from subtracting the number of zero bits from the number n2 of the entire bits of the column. Accordingly, the number of zero bits 230 may be obtained from the desired coding rate and the number of data bits 210.

In primary encoding, parity bits 250 may be calculated using values of data bits 210. Secondary encoding is performed on the encoded matrix including the data bits 210, the zero bits 230, and the parity bits 250. As a result, parity bits 270 are added to each column. For example, in the matrix encoded through the primary encoding and the secondary encoding, each row may include 57 bits as the sum of the data bits and the zero bits and 6 bits as the parity bits and each column may include 51 bits as the sum of the data bits and the zero bits and 13 bits as the parity bits.

In the method for producing error correction code shown in FIGS. 2A to 2C, the matrix encoded through the primary encoding and the secondary encoding may have a coding rate which is smaller than 1 but greater than 0.720. For example, the number of zero bits to comform to coding rates 0.591, 0.705, and 0.716 which are required for DVB-RCS NG standard is as shown in Table 1 below.

TABLE 1

|  | Coding Rates | | |
| --- | --- | --- | --- |
| Zero bit adding method | 0.591 | 0.705 | 0.716 |
| Row insertion | 39 | 26 | 21 |
| Column insertion | 26 | 10 | 3 |
| Row and column insertion | 21 | 3 | 1 |

In table 1, in the case of a coding rate of 0.591, thirty-nine zero bits are required for row insertion, twenty-six zero bits are required for column insertion, and twenty-one zero bits are required for row and column insertion.

In addition, in the case of a coding rate of 0.705, twenty-six zero bits are required for row insertion, ten zero bits are required for column insertion, and three zero bits are required for row and column insertion.

Moreover, in the case of a coding rate of 0.716, twenty-one zero bits are required for row insertion, three zero bits are required for column insertion, and one zero bit is required for row and column insertion.

Referring to FIG. 1 again, the zero bit column and/or the zero bit row which has been added during the generation of the asymmetric matrix are removed from the matrix encoded through the primary and secondary encodings (170). This is to reduce the amount of data to be transmitted. The removal of zero bits from the encoded matrix reduces the amount of data without affecting the desired coding rate, thereby reducing power consumption.

Figure 3:
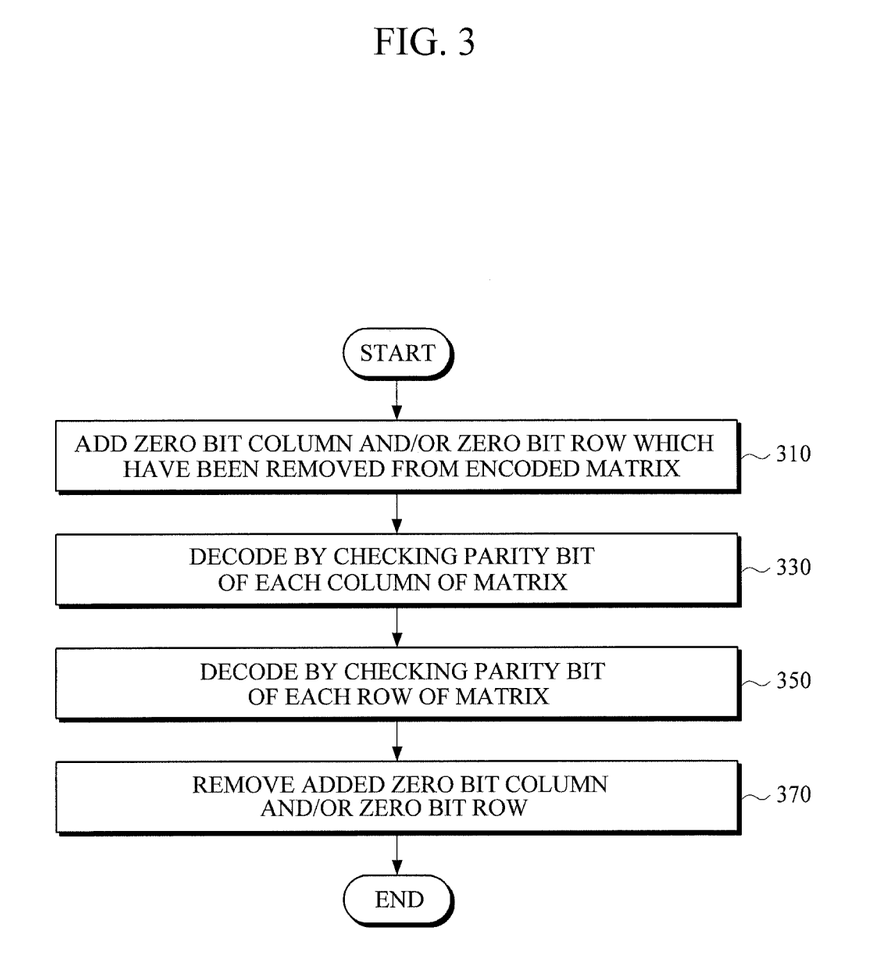
FIG. 3 is a flowchart illustrating an example of error correction decoding method.

FIG. 3 illustrates a flowchart of an example of error correction decoding method.

Referring to FIG. 3, the error correction decoding method adds as many zero bits as the number of zero bits which have been removed before an encoded matrix is transmitted (310). This is to compensate for the zero bits because error correction code encodes the matrix by padding the zero bits and the zero bits are removed after the encoding. Subsequently, the a parity bit of each column of the matrix to which the zero bits are added is checked to perform primary decoding of data of each column (330). In case of the error correction code, each column is encoded after encoding each row. However, in decoding process, the each column is decoded in the reverse order, and then extrinsic data is stored in buffer.

The parity bit of each row of the matrix that has undergone the primary decoding is checked to perform secondary decoding of data of each row (350). By checking the parity bit of each row, the presence of data error in transmission process is determined and the data error is corrected if present. After the secondary decoding, extrinsic data is extracted and default data stored in the buffer is updated. Once decoding of the error correction code is completed through the primary and secondary decoding processes, the zero bits that were added in the decoding processes are removed (370).

Figure 4:
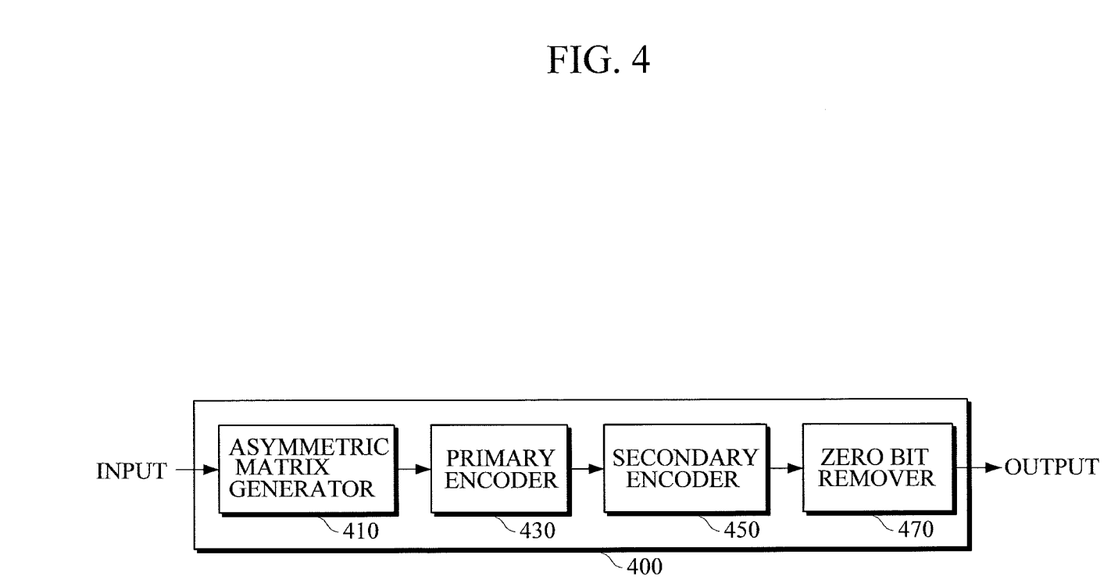
FIG. 4 is a diagram illustrating example of an apparatus for procuding error correction code.

FIG. 4 illustrates an example of an apparatus for producing error correction code.

Referring to FIG. 4, the apparatus 400 may include an asymmetric matrix generator 410, a primary encoder 430, a secondary encoder 450, and a zero bit remover 470. The asymmetric matrix generator 410 may receive data bits and arrange the data bits as a matrix of a predefined size. The asymmetric matrix generator 410 may generate an asymmetric matrix by adding zero bit column and/or zero bit row, each of which consists of zero bits, to the arranged matrix. A method of padding the zero bits may be the same as shown in FIGS. 2A to 2C. The asymmetric matrix generator 410 may output the asymmetric matrix to the primary encoder 430.

The primary encoder 430 may be an operation module that encodes the asymmetric matrix received from the asymmetric matrix generator 410. The primary encoder 430 may encode the asymmetric matrix after adding a parity bit in each row of the asymmetric matrix. In this case, the primary encoder 430 may recognize data bits of the asymmetric matrix and calculate the number and values of parity bits corresponding to the recognized data bits. The primary encoder 430 may add the calculated parity bit to an end of each row of the asymmetric matrix. The primary encoder 430 may output the primarily encoded matrix to the secondary encoder 450.

The secondary encoder 450 is an operation module that encodes the primarily encoded matrix received from the primary encoder 430. The secondary encoder 450 may encode the primarily encoded matrix after adding a parity bit to each column of the matrix. In this case, the secondary encoder 450 may recognize data bits of the primarily encoded matrix, and calculate the number and values of the parity bits corresponding to the recognized data bits. The secondary encoder 450 may add the calculated parity bit to an end of each row of the primarily encoded matrix. The secondary encoder 450 may output the secondarily encoded matrix to the zero bit remover 470.

The zero bit remover 470 is an operation module that removes the zero bits which were added to the matrix encoded by the primary encoder 430 and the secondary encoder 450. The zero bit remover 470 may remove unnecessary zero bits before the encoded matrix is transmitted. The zero bits are used to achieve a particular level of a coding rate in encoding process. However, once the encoding process is completed, the zero bits are not required any longer and only increase the amount of data, and thus they are removed.

The matrix code generated by the apparatus 400 for producing the error correction code is modulated through continuous phase modulation (CPM), and is then framed in conformity with digital Video Broadcasting—Return Channel by Satellite Next Generation (DVB-RCS NG) standards. Subsequently, the framed matrix code is transmitted to a network.

Figure 5:
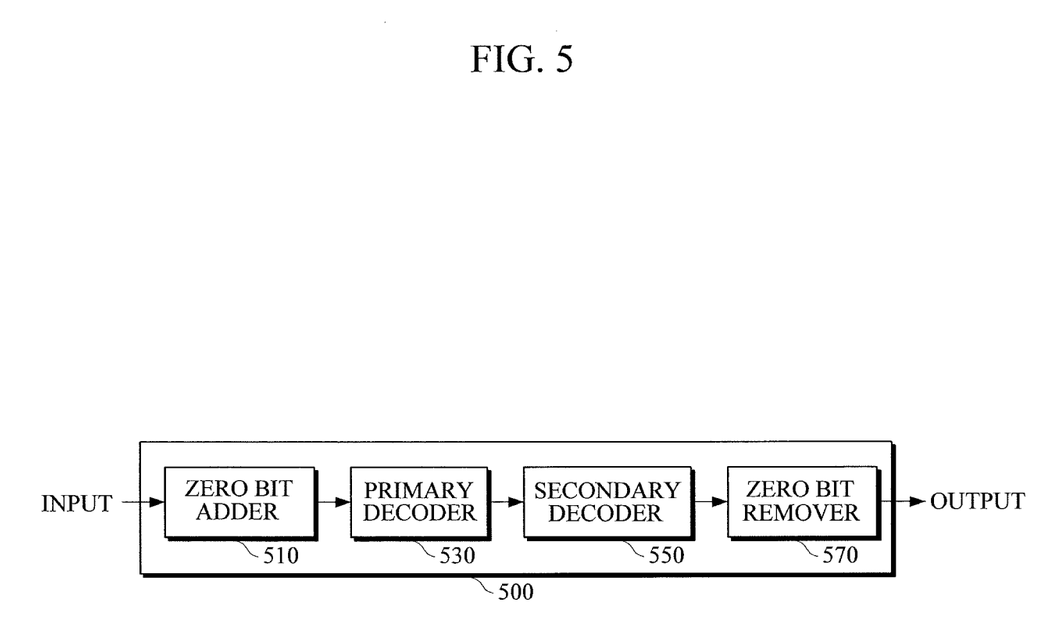
FIG. 5 is a diagram illustrating an example of an apparatus for error correction decoding.

FIG. 5 illustrates an example of an apparatus for error correction decoding.

Referring to FIG. 5, the apparatus 500 may include a zero bit adder 510, a primary decoder 530, a secondary decoder 550, and a zero bit remover 570. The zero bit adder 510 may add zero bits to encoded data in effort to decode the data. The zero bit adder 510 may add as many zero bits as the number of the zero bits which have been removed before error correction code that is input data is transmitted. This is because the zero bits are padded when the error correction code is encoded. The zero bit adder 510 may output to the primary decoder 530 a matrix that has the zero bits added thereto.

The primary decoder 530 may decode each column of the matrix unlike the error correction code producing apparatus as shown in the example of FIG. 4. In other words, the decoding apparatus decodes the matrix in a reverse order of the encoding. The primary decoder 530 may check the parity bits in each column to determine the presence of an error in transmission, and correct an error if present. Once the primary decoding on each column has been completed, the primary decoder 530 outputs the primarily decoded data to the secondary decoder 530.

The secondary decoder 550 may decode each row of the error correction code matrix which has been decoded by the primary decoder 530. The secondary decoder 550 may check the parity bits of each row to determine the presence of error in transmission, and correct an error if present. Once secondary decoding on each row has been completed, the secondary decoder 550 may output the secondary decoded data to the zero bit remover 570.

The zero bit remover 570 may receive the secondarily decoded data from the secondary decoder 550. In this case, the data is in the format of matrix, and includes zero bits. However, the zero bits are unnecessary data which are not relevant to the original data, and thus the zero bit remover 570 may identify data related to the zero bits and remove it. The zero bit remover 570 removes the zero bits from the secondarily decoded data and outputs the resultant data to an external device connected to the apparatus 500 for error correction decoding.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for producing error correction code, the method comprising:
    generating an asymmetric matrix by arranging input data bits in a matrix of a predefined size and adding a zero bit column and/or a zero bit row, each of the column and the row consisting of zero bits, to the matrix;
    primarily encoding the asymmetric matrix by adding one or more parity bits to each row; and
    secondarily encoding the primarily encoded matrix by adding one or more parity bits to each column of the encoded matrix.

2. The method of claim 1, wherein the primarily encoding of the asymmetric matrix comprises calculating the one or more parity bits based on data bits of each row of the asymmetric matrix and adding the calculated parity bits to the each row.

3. The method of claim 1, wherein the secondary encoding of the primarily encoded matrix comprises calculating the one or more parity bits based on data bits of the primarily encoded matrix and adding the calculated parity bits to the each column of the primarily encoded matrix.

4. The method of claim 1, wherein a length of the each row of the primarily encoded matrix is different from a length of the each column of the secondarily encoded matrix and a coding rate varies with the lengths of the each row and the each column.

5. The method of claim 1, wherein when the zero bit row is added in the generating of the asymmetric matrix, a coding rate of the primarily and secondarily encoded matrix is a product of a first coding rate and a second coding rate where the first coding rate is obtained by dividing the number of data bits included in a row of the encoded matrix by the number of the entire bits of the row and the second coding rate is obtained by dividing the number of data bits included in a column by a value resulting from subtracting the number of zero bits from the number of the entire bits of the column.

6. The method of claim 1, wherein when the zero bit column is added in the generating of the asymmetric matrix, a coding rate of the primarily and secondarily encoded matrix is a product of a first coding rate and a second coding rate where the first coding rate is obtained by dividing the number of data bits included in a row of the encoded matrix by a value resulting from subtracting the number of zero bits from the number of the entire bits of the row and the second coding rate is obtained by dividing the number of data bits included in a column of the encoded matrix by the number of the entire bits of the column.

7. The method of claim 1, wherein when the zero bit row and the zero bit column are added in the generating of the asymmetric matrix, a coding rate of the primarily and secondarily encoded matrix is a product of a first coding rate and a second coding rate where the first coding rate is obtained by dividing the number of data bits included in a row of the encoded matrix by a value resulting from subtracting the number of zero bits from the number of the entire bits of the row and the second coding rate is obtained by dividing the number of data bits included in a column of the encoded matrix by a value resulting from subtracting the number of zero bits from the number of the entire bits of the column.

8. The method of claim 1, wherein a coding rate of the primarily and secondarily encoded matrix varies with the number of zero bits.

9. The method of claim 1, further comprising:
removing the zero bit column and/or the zero bit row, which have been added for generating the asymmetric matrix, from the primarily and secondarily encoded matrix.

10. A method for error correction decoding, the method comprising:
receiving a data matrix which has been error-correction encoded and adding as many zero bits as the number of zero bits that were added when the data matrix was encoded;
checking a parity bit of each column of the data matrix which have the zero bits added thereto in an effort to primarily decode data in the each column; and
checking a parity bit of each row of the data matrix which have the zero bits added thereto in an effort to secondarily decode data in the each row.

11. The method of claim 10, further comprising:
removing the zero bits which have been added as many as the number of the zero bits that were removed when the data matrix was encoded.

12. An apparatus for producing error correction code, the apparatus comprising:
an asymmetric matrix generator configured to arrange input data bits in a matrix of a predefined size and generate an asymmetric matrix by adding a zero bit column and/or a zero bit row, each of the column and the row consisting of zero bits, to the matrix;
a primary encoder configured to encode the asymmetric matrix by adding a parity bit to each row; and
a secondary encoder configured to encode the primarily encoded matrix by adding a parity bit to each column of the primarily encoded matrix.

13. The apparatus of claim 12, further comprising:
a zero bit remover configured to remove one or more zero bits which have been added to the matrix encoded by the primary encoder and the secondary encoder.

14. An apparatus for error correction decoding, the apparatus comprising:
a zero bit adder configured to receive an error-correction encoded data matrix and add as many zero bits as the number of zero bits that were added when the matrix was encoded;
a primary decoder configured to check a parity bit of each column of the matrix which have the zero bits added thereto in an effort to decode data of the each column; and
a secondary decoder configured to check a parity bit of each row of the matrix decoded by the primary decoder in an effort to decode data of the each row.

15. The apparatus of claim 14, further comprising:
a zero bit remover configured to remove the zero bits which have been added by the zero bit adder from the matrix decoded by the secondary decoder.

* * * * *